US007755193B1

(12) United States Patent
 Masleid

(10) Patent No.: US 7,755,193 B1
(45) Date of Patent: Jul. 13, 2010

(54) NON-RECTILINEAR ROUTING IN RECTILINEAR MESH OF A METALLIZATION LAYER OF AN INTEGRATED CIRCUIT

(76) Inventor: Robert P. Masleid, 17266 Eaton La., Monte Sereno, CA (US) 95930

( * ) Notice: Subject to any disclaimer, the term of this patent is extended or adjusted under 35 U.S.C. 154(b) by 818 days.

(21) Appl. No.: 11/274,098

(22) Filed: Nov. 14, 2005

(51) Int. Cl.
 *H01L 23/12* (2006.01)
(52) U.S. Cl. .............................. 257/758; 257/E23.014
(58) Field of Classification Search ................. 257/758, 257/762, 765, 773, 776, 780, E23.151
 See application file for complete search history.

(56) References Cited

U.S. PATENT DOCUMENTS

| | | | |
|---|---|---|---|
| 5,272,600 | A | 12/1993 | Carey |
| 5,416,861 | A | 5/1995 | Koh et al. |
| 5,640,049 | A | 6/1997 | Rostoker et al. |
| 6,400,230 | B2 | 6/2002 | Fairbanks |
| 6,538,957 | B2 | 3/2003 | Magoshi |
| 6,696,863 | B2 | 2/2004 | Yamamoto et al. |
| 6,711,727 | B1 | 3/2004 | Teig et al. |
| 2002/0162079 | A1 | 10/2002 | Igarashi et al. |
| 2003/0127241 | A1 | 7/2003 | Russell et al. |
| 2003/0209766 | A1 * | 11/2003 | Blanchard .................. 257/390 |
| 2004/0044983 | A1 | 3/2004 | Dillon et al. |
| 2005/0023705 | A1 | 2/2005 | Campbell et al. |
| 2005/0138593 | A1 | 6/2005 | Okumura |
| 2005/0280159 | A1 | 12/2005 | Okumura |
| 2007/0136707 | A1 | 6/2007 | Teig et al. |

OTHER PUBLICATIONS

Final Office Action Mailed Apr. 10, 2009; U.S. Appl. No. 11/477,970.
Ronan Farrell; IC Fabrication Technology; Solid State Electonics.

* cited by examiner

*Primary Examiner*—Thomas L Dickey

(57) ABSTRACT

Non-rectilinear routing in a rectilinear mesh. In accordance with an embodiment of the present invention, an integrated circuit comprises a first substantially continuous metallization layer. The first substantially continuous metallization layer further comprises first and second portions electrically isolated from one another. The integrated circuit includes a trace disposed between and electrically isolated from the first and second portions of the first substantially continuous metallization layer. The trace is not parallel to an edge of the integrated circuit.

16 Claims, 7 Drawing Sheets

NON-RECTILINEAR ROUTING IN RECTILINEAR MESH OF A METALLIZATION LAYER OF AN INTEGRATED CIRCUIT

BACKGROUND OF THE INVENTION

1. Field of the Invention

Embodiments of the present invention relate to layout of integrated circuits.

2. Related Art

The propagation and wireability of signals across a chip can often be improved by non-rectilinear routing, e.g., diagonal routing, of such signals. Unfortunately, conventional integrated circuit layout tools are generally strongly biased toward rectilinear placement and routing, and ill suited for non-rectilinear placement and routing.

SUMMARY OF THE INVENTION

Accordingly, systems and methods of non-rectilinear routing are needed. In addition, systems and methods of non-rectilinear routing in a rectilinear mesh would be advantageous. Further, systems and methods of non-rectilinear routing in a rectilinear mesh that are compatible and complimentary with conventional integrated circuit layout systems and methods are highly desired.

Systems and methods of non-rectilinear routing in a rectilinear mesh are disclosed. In accordance with a first embodiment of the present invention, an integrated circuit comprises a substantially continuous metallization layer. The substantially continuous metallization layer may be for distributing power to elements of the integrated circuit.

In accordance with another embodiment of the present invention, a computer usable media comprises a plurality of tile representations for the layout of metal layers of an integrated circuit. The plurality of tile representations comprises a first tile representation for non-rectilinear routing in a rectilinear mesh.

In accordance with yet another embodiment of the present invention, an integrated circuit comprises a first substantially continuous metallization layer. The first substantially continuous metallization layer further comprises first and second portions electrically isolated from one another. The integrated circuit includes a trace disposed between and electrically isolated from the first and second portions of the first substantially continuous metallization layer. The trace is not parallel to an edge of the integrated circuit.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Figure 1:
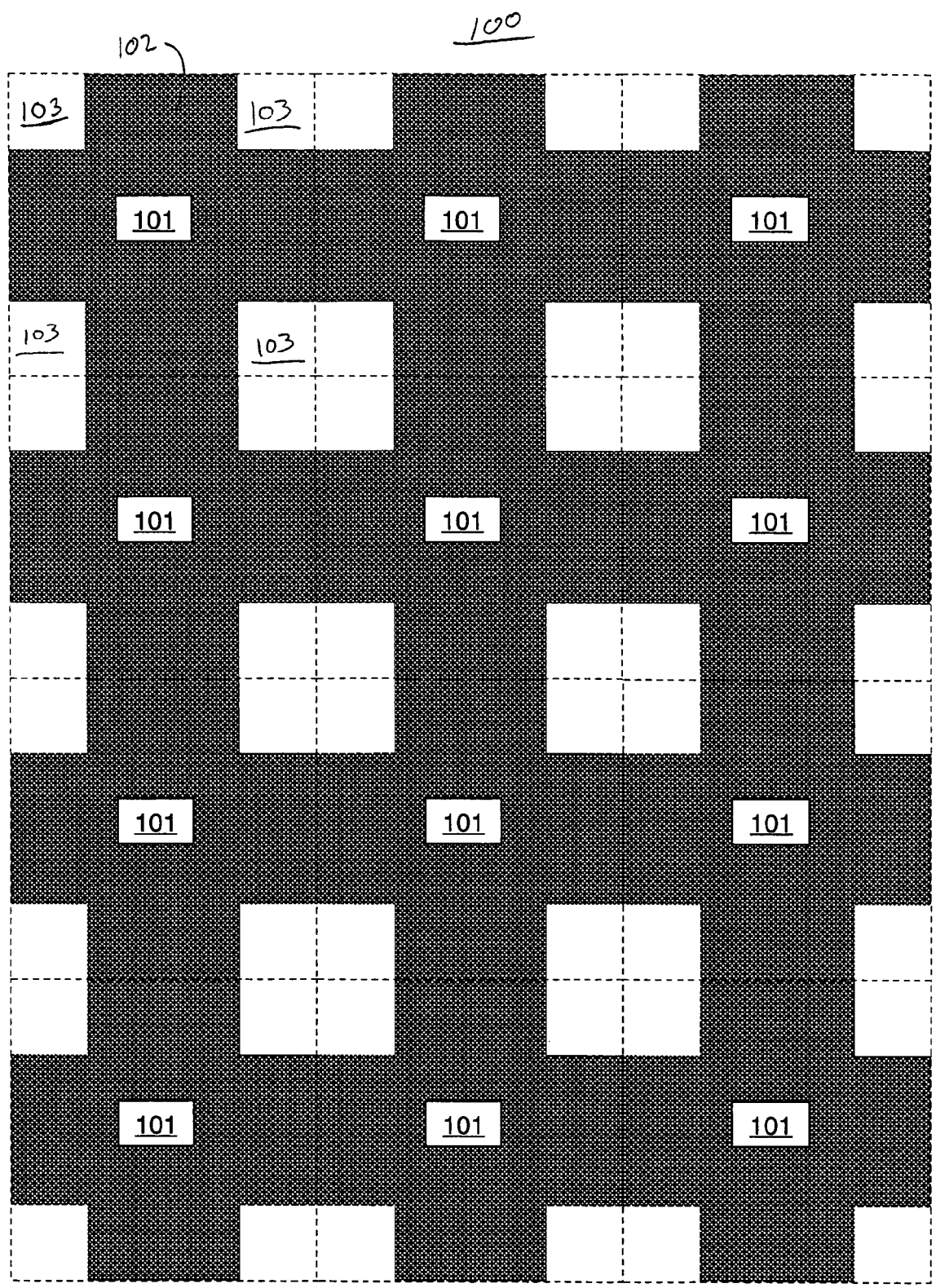
FIG. 1 illustrates a portion of a plane, in accordance with embodiments of the present invention.

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Most conventional art computer aided design (CAD) systems for the layout of an integrated circuit are based upon a building block approach. One type of "building block" is generally known or referred to as a "tile." A tile is generally a geometric object, e.g., a square element, represented graphically, that is used to populate a plane, e.g., to create planar geometric shapes. Tiles placed according to a rectilinear grid, e.g., as square tiles on a floor, are commonly used to define integrated circuit features, particularly for metallization layers.

Metallization layers of an integrated circuit are used predominately to couple semiconductor features. Such couplings generally take a form of one or more "traces." A trace is generally a long, narrow strip of metallization, roughly analogous to a wire. In general, a first metallization layer will comprise traces oriented in a direction parallel to an edge of an integrated circuit. There will generally be at least a second metallization layer comprising traces oriented in a direction perpendicular to the first layer's direction. It is appreciated that the orientation of traces on the second layer, while perpendicular to the direction of traces on the first layer, are nevertheless parallel to an edge of the integrated circuit.

A particular coupling, e.g., an electrical coupling between two circuit elements as represented schematically by a line (wire), may comprise a plurality of traces on multiple layers. For example, the coupling may be routed in a first direction on one level and in a perpendicular direction on another layer. Such changes of direction and layers may be repeated multiple times until the two terminals are coupled.

Due to the square nature of tiles and the rectilinear grid system within most CAD systems, such rectilinear layout of traces is straight-forward and intuitive. Moreover, the automated placement and routing systems of such CAD systems are highly biased, and frequently are exclusively limited, to rectilinear placement and routing.

In the conventional integrated circuit art, power, e.g., operating voltage, and ground are distributed throughout an integrated circuit by such traces on metallization layers. Consequently, a given metallization layer may generally comprise traces conducting signals as well as traces distributing power and/or ground.

FIG. 1 illustrates a portion of a plane 100, in accordance with embodiments of the present invention. Plane 100 may be, for example, a plane for distributing ground, Vss, or operating power, Vdd. In FIG. 1, dark areas represent metal and light areas represent no metal. Plane 100 may comprise large areas of a metal layer, e.g., large in comparison to typical trace widths of the integrated circuit, or substantially all of a metal layer. Plane 100 is formed in a metallization layer of an integrated circuit, in accordance with a graphical pattern made up of tiles arrayed in a rectilinear mesh or grid. Plane 100 comprises a plurality of substantially similar instances of tile 101 arrayed in such a rectilinear grid. The light-colored box around the item number is for clarity and does not represent a structure.

Tile 101 is square, for example, 8.0 micrometers on a side. Tile 101 comprises a generally cruciform area of metal 102 in addition to four isolated regions of no metal, e.g., regions 103. For example, the vertical and horizontal "stripes" of metal in tile 101 have a width of 4.0 micrometers. In general, integrated circuit design rules limit the density of metallization. The metal 102 and no metal 103 areas of tile 101 are intended to comply with such rules in an electrically advantageous manner. The design of tile 101 should approach the design rule metal density limit such that, for example, plane 100 achieves a density of at least 90 percent of the density limit. As shown in FIG. 1, the exemplary embodiment of plane 100 illustrates a metal density of about 75 percent metal.

Advantageously, a plane such as plane 100 may simplify distribution of power throughout an integrated circuit. As an additional benefit, a pair of power planes for distributing operating voltage and ground may provide a valuable high frequency decoupling capacitance to the power distribution network. Further, such power planes generally improve signal return paths, reducing loop currents and thus further improve signal quality.

Frequently, the performance and/or wireability of an integrated circuit, e.g., a microprocessor, may be enhanced via non-rectilinear, e.g., diagonal, routing of a some signals, e.g., "clock" signals. Such non-rectilinear routing can advantageously reduce trace length and/or signal inductance.

A conventional approach to create such diagonal routing is advocated by the "X Initiative" (see www.xinitiative.org as background material). In accordance with this approach, two or more metallization layers are dedicated to traces at 45 degree angles to the edges of an integrated circuit. It is to be appreciated that the placement and routing techniques of the X Initiative are "gridless." Unfortunately, such gridless layout is generally neither compatible nor complementary with existing CAD systems and requires numerous changes to integrated circuit design systems and methodologies.

Figure 2:
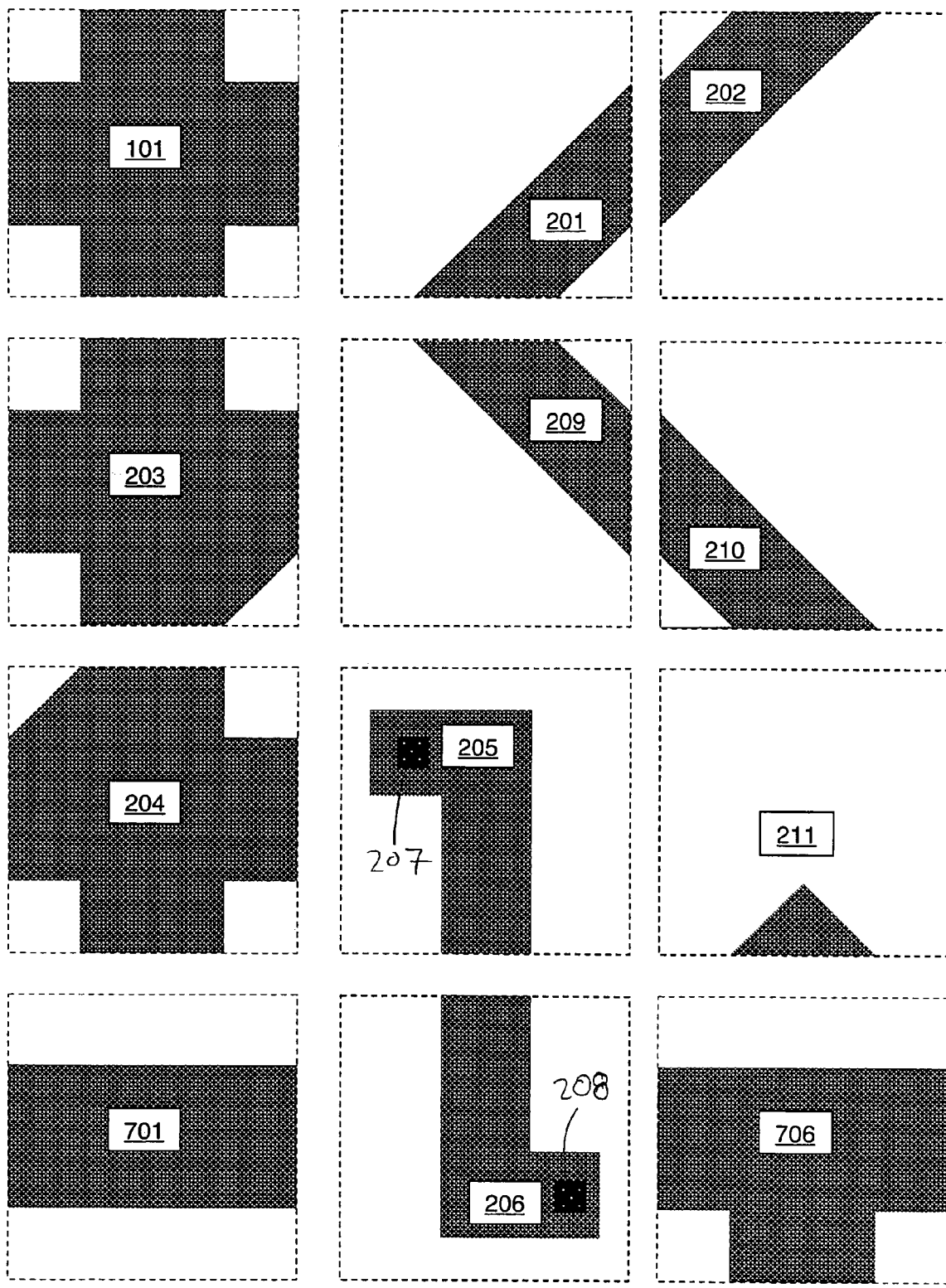
FIG. 2 illustrates a set of tiles, in accordance with embodiments of the present invention.

FIG. 2 illustrates a set of tiles, in accordance with embodiments of the present invention. Tiles 201 through 204 may be utilized to implement non-rectilinear routing of wires in a rectilinear mesh or grid. Tile 201 comprises a diagonal "stripe," e.g., about 2.83 microns in width in one embodiment, of metal in a lower right portion of the tile. Tile 202 comprises a diagonal stripe, e.g., about 2.83 microns in width, of metal in an upper left portion of the tile. It is appreciated that tile 202 may be constructed as a rotated version of tile 201.

Tile 203 may be understood as a superposition of tile 101 with tile 201. Tile 203 comprises a generally cruciform area of metal and an additional contiguous triangle of metal in the lower right. In a similar manner, tile 204 may be understood as a superposition of tile 101 with tile 202. Tile 204 comprises a generally cruciform area of metal and an additional contiguous triangle of metal in the upper right. It is to be appreciated that, in an actual layout, equivalents of tiles 203 and 204 may be constructed by overlays of other tiles, e.g., an equivalent of tile 203 may be constructed by an overlay of tile 101 with tile 201, as most CAD systems support overlays of tiles to form more complex patterns on a single layer.

Tiles 205 and 206 are generally used to construct routings on a second layer to bypass a routing or structure on a first layer. Tiles 701 and 706 are generally used to construct routes that are parallel to an edge of an integrated circuit. Tile 211 is generally used in forming corners between routes that are at 45 degree angles to an edge of an integrated circuit.

Figure 3:
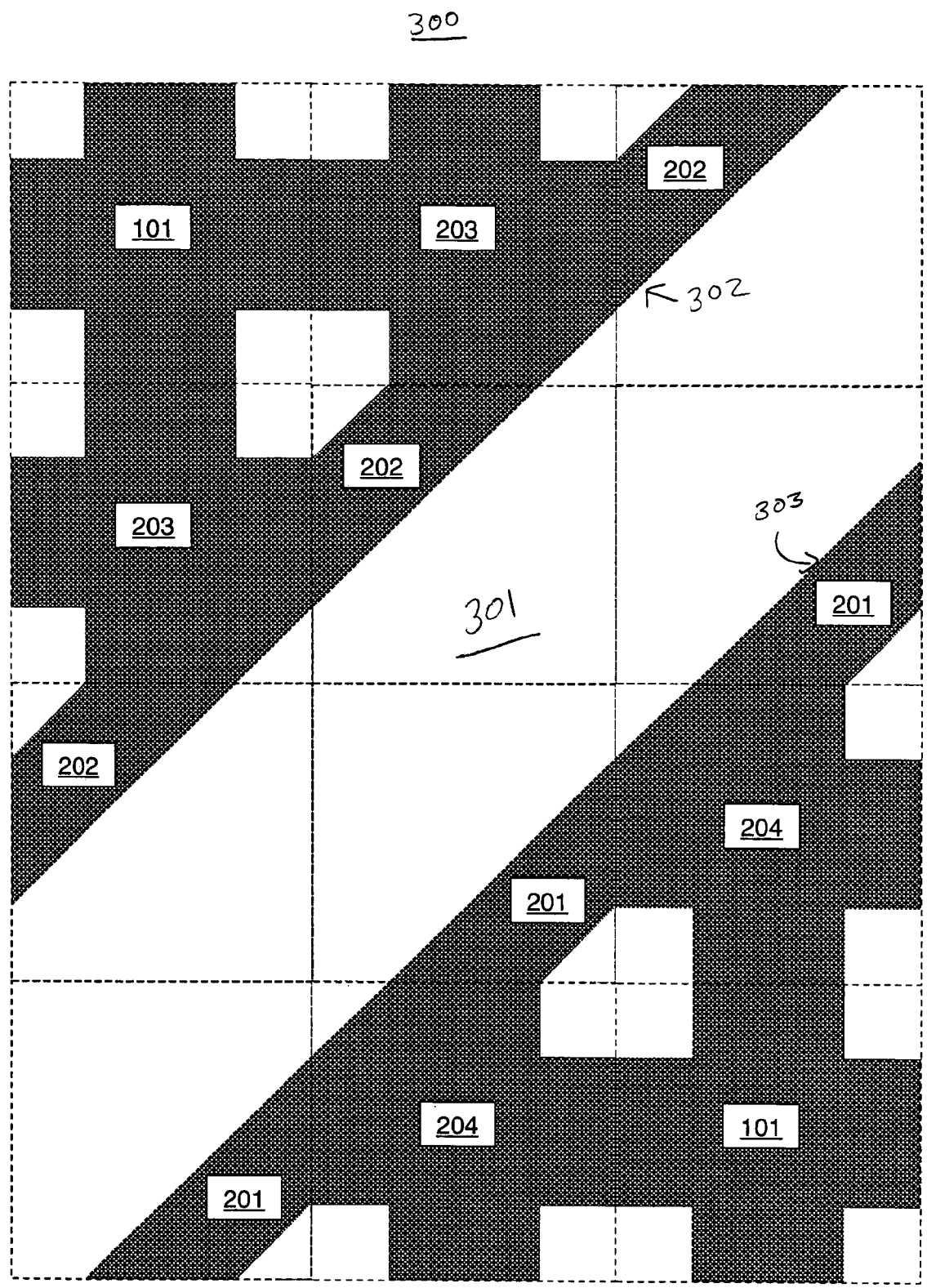
FIG. 3 illustrates a portion of another plane, in accordance with embodiments of the present invention.

FIG. 3 illustrates a portion of a plane 300, e.g., a power plane for distributing Vss or Vdd, in accordance with embodiments of the present invention. Plane 300 is formed in a metallization layer of an integrated circuit. In FIG. 3, dark areas represent metal and light areas represent no metal. Plane 300 comprises a plurality of tiles arrayed in a rectilinear grid, of a variety of tile designs. As illustrated, plane 300 comprises two instances of tile 101, two instances of tile 201, two instances of tile 203, three instances of tile 201 and three instances of tile 202.

Plane 300 comprises a channel 301, of, for example, about 8.58 microns in width. For example, the width of channel 301 is about three times the width of the metal stripes of tiles 201 and 202. It is to be appreciated that portion 302 of plane 300 is isolated from portion 303 for the length of channel 301. As shown in FIG. 3, the exemplary embodiment of plane 300 illustrates a metal density of about 48 percent metal. It is to be appreciated that in areas distant from channel 301, the metal density of plane 300 may approach that of plane 100, e.g., 75 percent metal.

Figure 4:
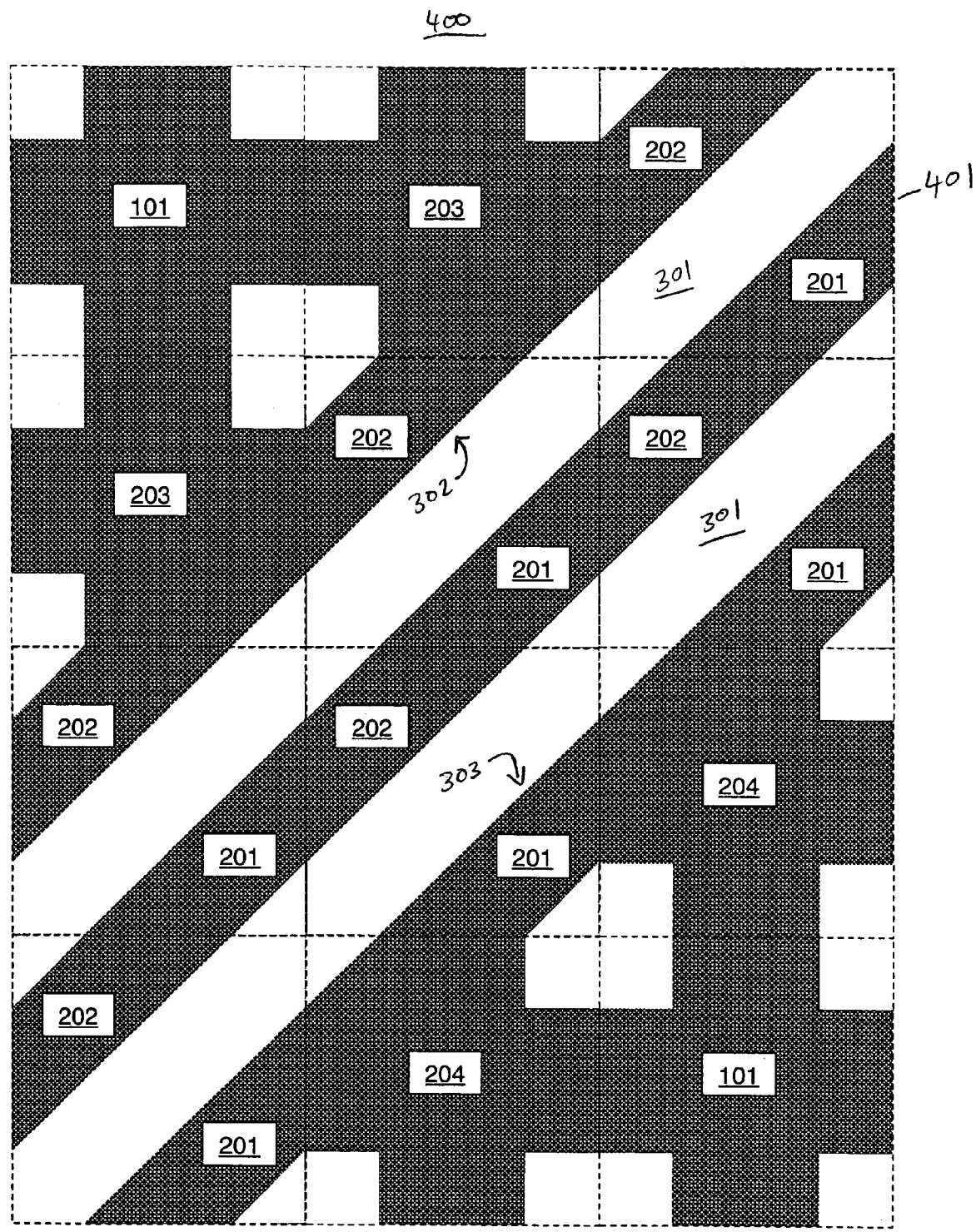
FIG. 4 illustrates a portion of yet another plane, in accordance with embodiments of the present invention.

FIG. 4 illustrates a portion of a plane 400, e.g., a power plane for distributing Vss or Vdd, in accordance with embodiments of the present invention. Plane 400 comprises a trace 401 through channel 301. It is appreciated that trace 401 is isolated from portion 302 of plane 300 and also isolated from portion 303 of plane 300.

Trace 401 is constructed by overlaying instances of tiles 201 and 202 over the structure of plane 300 (FIG. 3) arrayed in a rectilinear grid. It is appreciated that if a particular CAD system does not support such overlays, 128 tiles equivalent to such combinations may be designed and used to form trace 401. As shown in FIG. 4, the exemplary embodiment of plane 400 illustrates a metal density of about 57 percent metal. It is to be appreciated that in areas distant from channel 401, the metal density of plane 400 may approach that of plane 100, e.g., 75 percent metal.

In this novel manner, an advantageous non-rectilinear trace routing, e.g., trace 401, may be constructed in a rectilinear mesh in a manner that is complimentary and compatible with CAD systems based upon rectilinear placement.

Referring once again to FIGS. 3 and 4, as discussed above, it is to be appreciated that portion 302 of planes 300 and 400 is isolated from portion 303 of planes 300 and 400 for the length of channel 301. Such a separation of a power plane is generally a disadvantageous construction, as such gaps in planes generally deleteriously increase resistance and inductance for power distribution and detrimentally create loop currents for return signal paths.

Referring once again to FIG. 2, FIG. 2 further illustrates tiles 205 and 206. Tile 205 comprises an "L" shaped metallization and a contact 207. Contact 207 is a structure for making contact with another layer of an integrated circuit. Tile 206 comprises an "L" shaped metallization and a contact 208. Contact 208 is a structure for making contact with another layer of an integrated circuit. It is to be appreciated that tile 206 may be constructed as a rotated version of tile 205.

Figure 5:
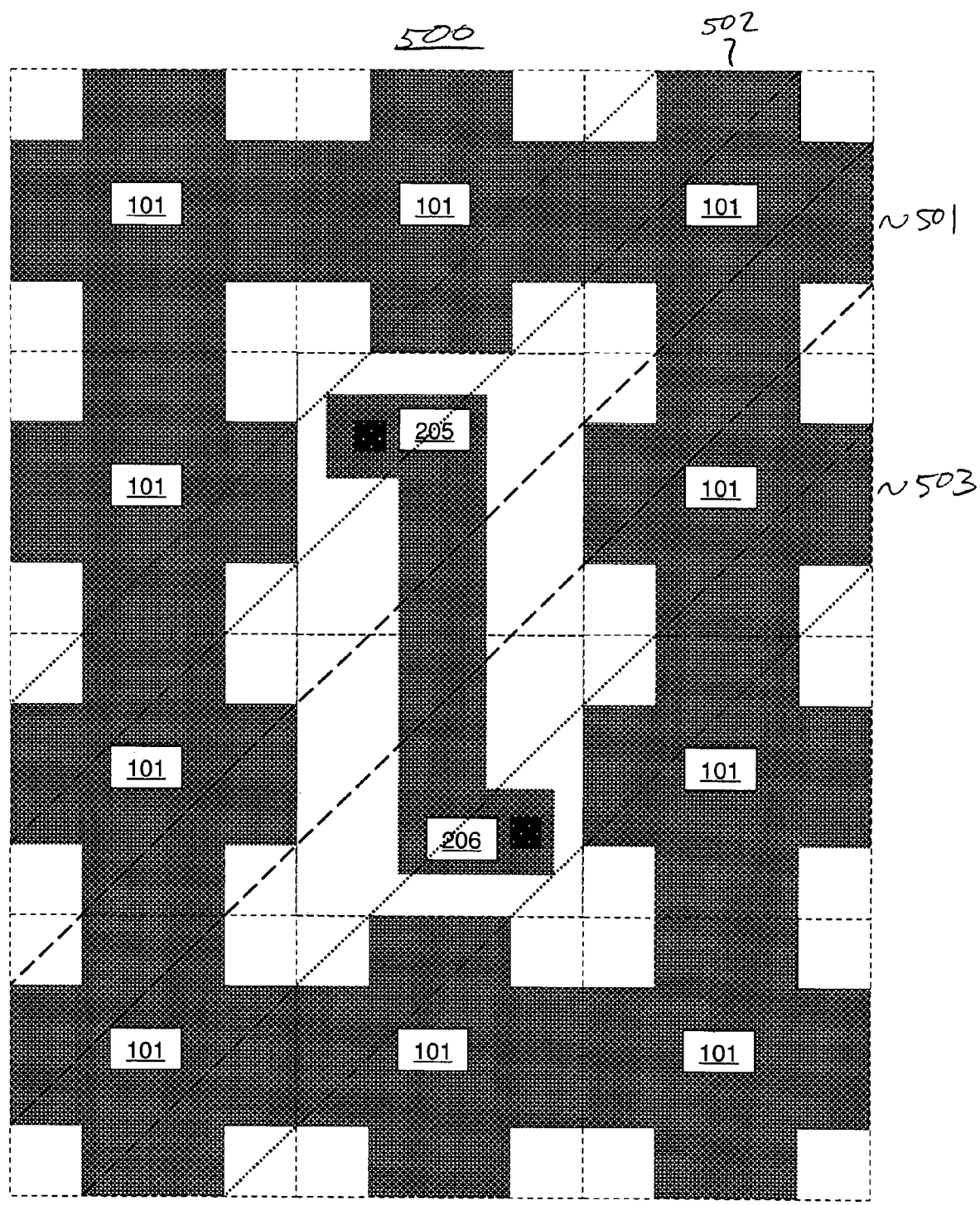
FIG. 5 illustrates a portion of still another plane, in accordance with embodiments of the present invention.

FIG. 5 illustrates a portion of a plane 500, e.g., a power plane for distributing Vss or Vdd, in accordance with embodiments of the present invention. Plane 500 comprises a plurality of tiles arrayed in a rectilinear grid, of a variety of tile designs. Plane 500 is complementary to plane 400 (FIG. 4). For example, if plane 400 is used to distribute Vdd and a critical signal on trace 401, then plane 500 is typically located in a layer adjacent to plane 400, and is used to distribute Vss. It is appreciated that the roles of such paired planes can be reversed.

Plane 500 comprises ten instances of tile 101, one instance of tile 205 and one instance of tile 206, arrayed in a rectilinear grid. Projection 501, shown as a diagonal stripe bounded by dotted lines, illustrates the projection of trace 401 onto plane 500. Projection 502 illustrates the projection of the edge of portion 302 of plane 400 onto plane 500. Similarly, projection 503 illustrates the projection of the edge of portion 303 of plane 400 onto plane 500. The contacts 207 and 208 are electrically coupled to plane 400. As shown in FIG. 5, the exemplary embodiment of plane 500 illustrates a metal density of about 66 percent metal. It is to be appreciated that in areas distant from tiles 205 and 206, the metal density of plane 500 may approach that of plane 100, e.g., 75 percent metal.

In accordance with embodiments of the present invention, tiles 205 and 206, in the arrangement show in FIG. 5, form a "jumper" or short path between portions 302 and 303 of plane 400, thereby mitigating the deleterious effects of separating portions 302 and 303 on their own metal layer, while minimizing disruptive impacts to plane 500.

Referring once again to FIG. 2, FIG. 2 further illustrates tile 211. Tile 211 comprises metallization in the shape of a right triangle with the hypotenuse or base of the triangle at the bottom edge of the tile 211. For example, the base of the triangle is about 4.0 micrometers.

Figure 6:
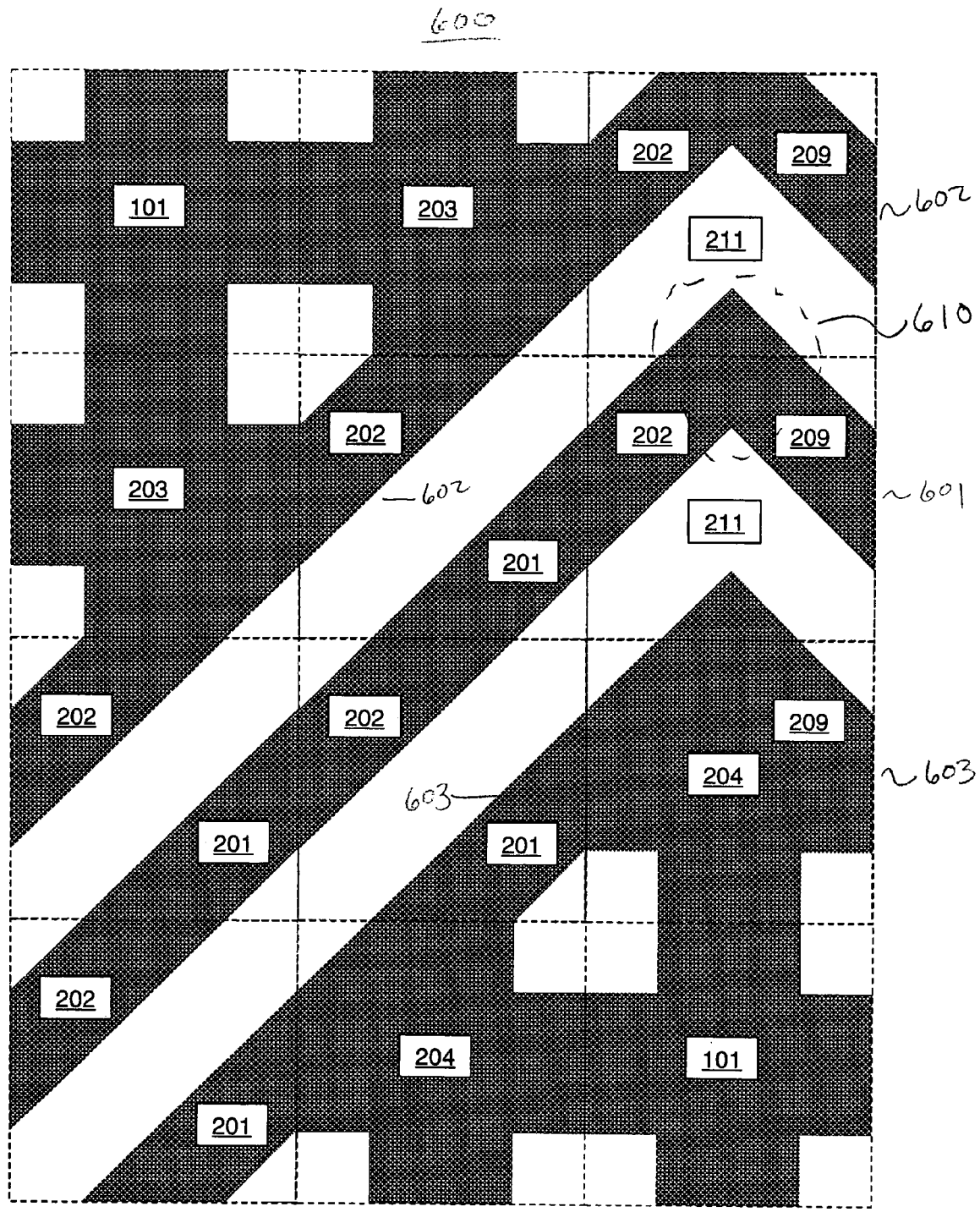
FIG. 6 illustrates a portion of still yet another plane, in accordance with embodiments of the present invention.

FIG. 6 illustrates a portion of a plane 600, e.g., a power plane for distributing Vss or Vdd, in accordance with embodiments of the present invention. Plane 600 comprises a trace 601. It is appreciated that trace 601 is isolated from portion 602 of plane 600 and isolated from portion 603 of plane 600. As shown in FIG. 6, the exemplary embodiment of plane 600 illustrates a metal density of about 57 percent metal. It is to be appreciated that in areas distant from channel 601, the metal density of plane 600 may approach that of plane 100, e.g., 75 percent metal.

It is to be appreciated that trace 601 makes a right angle turn in region 610. In accordance with embodiments of the present invention, tile 211 (FIG. 2) can be layered over other tiles, e.g., tiles 202 and 209, to present a "square" corner to trace 601. In addition, tile 211 can be layered over other tiles to form parallel edges and corners of portions 602 and 603 of plane 600. It is appreciated that if a particular CAD system does not support such overlays, a tile equivalent to the combination of tiles illustrated may be designed and used to form a corner of trace 601.

It is to be appreciated that embodiments in accordance with the present invention realize non-rectilinear routing, e.g., trace 401 of FIG. 4, through the utilization of novel rectilinear tile structures. Such rectilinear structures are arrayed in a rectilinear grid or mesh. For example, trace 401 is realized with no diagonal placement and uses only rectilinear placement.

It is to be further appreciated that placement and routing of signal paths within integrated circuits generally comprise right angle turns, e.g., a signal travels in a trace on a first layer of metallization and transitions to a second trace on a second layer of metallization traveling in a perpendicular direction. It can be desirable for certain signals, e.g., high speed, analog and/or critical impedance signals, to avoid such "sharp" turns in the signal path. Embodiments in accordance with the present invention are well suited to "smoothing" such signal paths, for example, by making two 45 degree turns instead of a single 90 degree turn.

For example, a critical signal traveling in a trace on a first layer of metallization generally used for signal traces can transition to a perpendicular trace on a second layer of metallization generally used for signal traces via an intermediate routing on a third layer of metallization generally not used for signal traces, e.g., a power plane. The signal path makes two 45 degree turns on the third layer.

Figure 7:
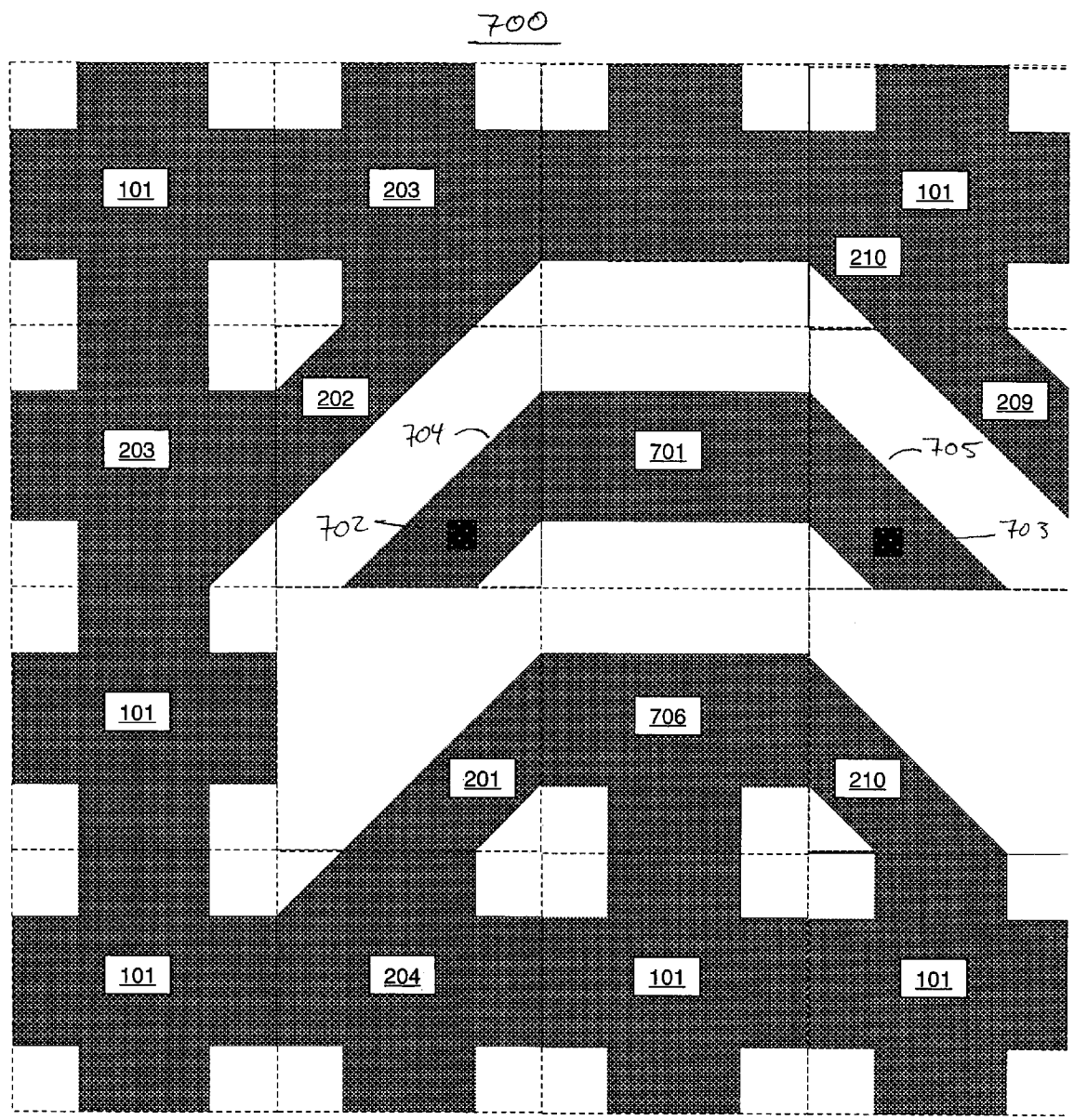
FIG. 7 illustrates a portion of yet still another plane, in accordance with embodiments of the present invention.

FIG. 7 illustrates a portion of a plane 700, e.g., a power plane for distributing Vss or Vdd, in accordance with embodiments of the present invention. Plane 700 comprises a horizontal trace 701 and two angled traces 704 and 705. The angle angled traces 704 and 705 comprise contacts 702 and 703 for coupling with other layers of the integrated circuit, e.g., wiring metal layers. For example, contact 702 may couple with a trace in a "horizontal" direction on another layer and contact 703 may couple to a trace in a "vertical" direction on a different layer. As shown in FIG. 7, the exemplary embodiment of plane 700 illustrates a metal density of about 60 percent metal. It is to be appreciated that in areas distant from contacts 703 and 704, the metal density of plane 700 may approach that of plane 100, e.g., 75 percent metal.

In accordance with other embodiments of the present invention, traces may be routed in a variety of directions, e.g., horizontally, vertically, and/or at 45 degree or other angles that are non-rectilinear, within a single layer, e.g., plane 700 (FIG. 7).

Although embodiments in accordance with the present invention illustrated herein are presented in terms of non-rectilinear routings of 45 degrees, embodiments in accordance with the present invention are well suited to routings at any angle characterized as having a tangent that is a rational number. For example, two tiles may be designed such that a trace traverses two tile-widths horizontally for every one tile-height change vertically. Such a trace has a slope or tangent of 1/2.

In summary, embodiments of the present invention provide systems and methods of non-rectilinear routing. In addition, embodiments of the present invention provide systems and methods of non-rectilinear routing in a rectilinear mesh. Further, the systems and methods of non-rectilinear routing in a rectilinear mesh disclosed are compatible and complimentary with conventional integrated circuit layout systems and methods.

Embodiments in accordance with the present invention are thus described. While the present invention has been described in particular embodiments, it should be appreciated that the present invention should not be construed as limited by such embodiments, but rather construed according to the below claims.

What is claimed is:

1. An integrated circuit comprising
   a first substantially continuous metallization layer, the layer being substantially planar and including:
      first components aligned within the layer at a first direction;
      second components aligned within the layer at a second direction different from the first direction; and intersection components between the first and second components wherein the first, second and intersection components are in electrical contact and lie within a single metallization layer, wherein metal density of said substantially continuous metallization layer is at least 90 percent of the design rule limit for metal density of a metal layer of said integrated circuit.

2. The integrated circuit of claim 1 in which said first substantially continuous metallization layer is for distributing first power to elements of said integrated circuit.

3. The integrated circuit of claim 2 further comprising a second substantially continuous metallization layer.

4. The integrated circuit of claim 3 wherein said second substantially continuous metallization layer is for distributing a second power complementary to said first power.

5. The integrated circuit of claim 3 in which said substantially similar tiles are arrayed on a rectilinear grid.

6. The integrated circuit of claim 1 in which said first substantially continuous metallization layer comprises a plurality of substantially similar tiles.

7. An integrated circuit comprising:
a first metallization layer comprising at least 48 percent metal over the extent of the first metallization layer; and
wherein said first metallization layer comprises first and second portions electrically isolated from one another.

8. The integrated circuit of claim 7 wherein adjacent boundaries of said first and second portions are parallel.

9. The integrated circuit of claim 8 wherein said adjacent boundaries of said first and second portions are aligned nonparallel to an edge of said integrated circuit.

10. The integrated circuit of claim 7 further comprising a trace disposed between and electrically isolated from said first and second portions of said first substantially continuous metallization layer.

11. The integrated circuit of claim 7 comprising:
a second metallization layer comprising at least 60 percent metal over the extent of the second metallization layer; and
wherein said second metallization layer comprises a structure to electrically couple said first and second portions of said first metallization layer.

12. The integrated circuit of claim 11 further comprising:
a trace disposed between and electrically isolated from said first and second portions of said first metallization layer; and
wherein said structure spans a projection of said trace onto said second metallization layer.

13. The integrated circuit of claim 12 wherein said trace is nonparallel to an edge of said integrated circuit.

14. An integrated circuit comprising:
a first metallization layer comprising a plurality of traces oriented in a first direction;
a second metallization layer comprising a plurality of traces oriented in a direction perpendicular to said first direction;
a third metallization layer comprising at least 48 percent metal over the extent of the third metallization layer; and
a signal path comprising a plurality of traces on said first, second and third metallization layers; and
wherein said plurality of traces on said third metallization layer comprises a trace that is nonparallel to said first and second directions.

15. The integrated circuit of claim 14 wherein said first and second directions are substantially parallel to an edge of said integrated circuit.

16. The integrated circuit of claim 14 wherein said plurality of traces on said third metallization layer comprises a plurality of turns of less than 90 degrees.

* * * * *